(12) United States Patent
Lamesch

(10) Patent No.: US 9,678,144 B2
(45) Date of Patent: Jun. 13, 2017

(54) PIEZOELECTRIC OR ELECTRET SENSING DEVICE

(71) Applicant: IEE INTERNATIONAL ELECTRONICS & ENGINEERING S.A., Echternach (LU)

(72) Inventor: Laurent Lamesch, Reichlange (LU)

(73) Assignee: IEE International Electronics & Engineering S.A., Echternach (LU)

( * ) Notice: Subject to any disclaimer, the term of this patent is extended or adjusted under 35 U.S.C. 154(b) by 52 days.

(21) Appl. No.: 14/439,549

(22) PCT Filed: Oct. 16, 2013

(86) PCT No.: PCT/EP2013/071570
§ 371 (c)(1),
(2) Date: Apr. 29, 2015

(87) PCT Pub. No.: WO2014/067777
PCT Pub. Date: May 8, 2014

(65) Prior Publication Data
US 2015/0301105 A1    Oct. 22, 2015

(30) Foreign Application Priority Data

Oct. 29, 2012    (LU) ........................................ 92090

(51) Int. Cl.
*G01R 31/02*    (2006.01)
*G01R 31/28*    (2006.01)
(Continued)

(52) U.S. Cl.
CPC .......... *G01R 31/2829* (2013.01); *B60R 25/00* (2013.01); *G01H 11/08* (2013.01);
(Continued)

(58) Field of Classification Search
USPC .... 324/750.3, 727, 537, 500, 679, 523, 681, 324/683, 691, 713, 750.01; 702/182, 58;
(Continued)

(56) References Cited

U.S. PATENT DOCUMENTS 4,807,482 A * 2/1989 Park ........................ G01D 1/06
374/177
5,404,128 A * 4/1995 Ogino .................... B60R 22/48
180/273
(Continued)

FOREIGN PATENT DOCUMENTS

CN    101801730 A    8/2010
CN    102192758 A    9/2011
(Continued)

OTHER PUBLICATIONS

International Search Report and Written Opinion issued Apr. 3, 2014; re: Application No. PCT/EP2013/071570; citing: EP 2 036 780 A1, EP 0 560 351 A2, WO 03/019205 A1, US 2010/056937 A1, FR 2 943 233 A1, WO 2011/154467 A1, EP 2 368 772 A1 and EP 2 474 811.
(Continued)

*Primary Examiner* — Melissa Koval
*Assistant Examiner* — Nasima Monsur
(74) *Attorney, Agent, or Firm* — Reising Ethington P.C.

(57) ABSTRACT

A piezoelectric and/or electret sensing device includes a piezoelectric and/or electret transducer for producing a measurement current in response to mechanical stimulus, and a control and evaluation circuit connected to the transducer. The control and evaluation circuit includes a transimpedance amplifier having a first and a second input, the transducer being operatively connected between the first input and a reference node, and an electrical waveform generator for generating an electrical waveform, the elec-
(Continued)

trical waveform generator being operatively connected between the second input and the reference node.

12 Claims, 4 Drawing Sheets

(51) Int. Cl.
*B60R 25/00* (2013.01)
*G01H 11/08* (2006.01)
*H01L 41/113* (2006.01)
*G01R 29/22* (2006.01)

(52) U.S. Cl.
CPC ............ *G01R 31/02* (2013.01); *G01R 31/024* (2013.01); *H01L 41/1132* (2013.01); *G01R 29/22* (2013.01)

(58) Field of Classification Search
USPC ...... 73/862.68, 514.16, 514.29, 763, 861.27, 73/862.625; 310/317, 339; 381/150, 381/190, 71.7
See application file for complete search history.

(56) References Cited

U.S. PATENT DOCUMENTS

| | | | |
|---|---|---|---|
| 6,378,900 B1 * | 4/2002 | Stanley | B60N 2/002 280/735 |
| 6,531,884 B1 | 3/2003 | Kleven | |
| 8,508,217 B2 | 8/2013 | Eguchi | |
| 2004/0194532 A1 * | 10/2004 | Lally | G01D 3/08 73/1.82 |
| 2010/0056937 A1 | 3/2010 | Imamura et al. | |
| 2010/0295563 A1 * | 11/2010 | Bieck | B60N 2/002 324/679 |
| 2011/0204877 A1 * | 8/2011 | Eguchi | G01D 18/00 324/123 R |
| 2012/0197138 A1 | 8/2012 | Vrazic et al. | |

FOREIGN PATENT DOCUMENTS

| | | |
|---|---|---|
| CN | 102355850 A | 2/2012 |
| EP | 0560351 A2 | 9/1993 |
| EP | 2036780 A1 | 3/2009 |
| EP | 2368772 A1 | 9/2011 |
| EP | 2474811 A1 | 7/2012 |
| FR | 2943233 A1 | 9/2010 |
| WO | 03019205 A1 | 3/2003 |
| WO | 2011154467 A1 | 12/2011 |

OTHER PUBLICATIONS

Chinese Office Action in Chinese with English translation for CN application No. 201380056586.7, dated Dec. 26, 2016, 24 pages.

* cited by examiner

PIEZOELECTRIC OR ELECTRET SENSING DEVICE

TECHNICAL FIELD

The present invention generally relates to piezoelectric or electret sensors, which may e.g. be used for detecting vibration or displacement. More specifically, the present invention relates to diagnostics of such sensors.

BACKGROUND ART

Piezoelectric or electret transducers are well known as such. They are typically used to convert a mechanical stimulus (such as vibration, movement, strain etc.) into an electrical signal.

US patent application 2010/0295563 A1 discloses an occupant detection system with an electrode arrangement for a seat of an automotive vehicle, wherein the electrode arrangement includes a first electrode, a second electrode and an electric insulator layer sandwiched between the first and second electrodes. When the electrode arrangement is in place in the seat, the first electrode forms with vehicle ground a first capacitor having a first capacitance influenceable by an occupying item in the detection region through interaction of the occupying item with the electric field, the first electrode forms with the second electrode a second capacitor having a second capacitance and the second electrode forms a first capacitor plate of a third capacitor having a third capacitance. The second plate of the third capacitor may be formed by conductive surfaces at vehicle ground potential or a third electrode formed by further conductive surface in the vehicle seat, e.g. a seat heater, the seat pan or a third electrode arranged behind the second electrode (as seen from the first electrode). The fluctuations of at least one of the first, second and third capacitances are measured and the frequency spectrum of the measured fluctuations is analyzed in order to obtain an indicator of the seat occupancy state. According to a preferred embodiment of the invention of US 2010/0295563 A1, the electric insulator layer between the first and the second electrode comprises an electret layer and/or a piezoelectric layer. In this configuration, the evaluation circuit determines, among others, a current induced in the first and/or second electrode by the electret or piezoelectric layer (in response to pressure being applied to the electret or piezoelectric layer) and derives the fluctuations of the second capacitance from the induced current.

U.S. Pat. No. 6,531,884 B1 relates to a diagnostics device for testing a piezoelectric sensor. The diagnostics device includes an AC source that applies an AC signal to the piezoelectric sensor at two or more different frequencies. Measurement circuitry coupled to the piezoelectric sensor measures a response of the sensor to the applied AC signal and provides a measured output related to a sensor resistance and a sensor capacitance of the piezoelectric sensor. Diagnostic circuitry provides a diagnostic output as a function of the measured output. As a disadvantage of the disclosed system, the measurement mode and the diagnostics mode must be carried out one after the other.

BRIEF SUMMARY

An improved piezoelectric and/or electret sensing device with self-diagnostics capability is herein provided.

A piezoelectric and/or electret sensing device comprises a piezoelectric and/or electret transducer for producing a measurement current in response to mechanical stimulus, and a control and evaluation circuit connected to the transducer. According to the invention, the control and evaluation circuit comprises a transimpedance amplifier having a first input and a second input, the transducer being operatively connected between the first input and a reference node (e.g. a node at ground potential), and an electrical waveform generator for generating an electrical waveform, the electrical waveform generator being operatively connected between the second input and the reference node. The transimpedance amplifier is configured to control the first input such that the difference in electric potential between the first input and the second input be cancelled and to output an output voltage, with respect to the electric potential at the reference node, indicative of electrical current flowing across the transducer. The control and evaluation circuit is configured to identify a first component of the output voltage indicative of the measurement current and a second component of the output voltage indicative of the current caused by the generation of the waveform. The control and evaluation circuit is, furthermore, configured to detect a short circuit and/or a broken wire based upon the second component. Such short circuit or broken wire may e.g. be detected by comparing the second component with a respective threshold.

As will be appreciated, the piezoelectric and/or electret transducer and the waveform generator (which may e.g. comprise an oscillator and/or a pseudo-random noise generator) are connected electrically in series between the first input and the second input of the transimpedance amplifier. The waveform generator produces its waveform in a portion of the frequency spectrum that is not occupied by the measurement signal output by the transducer, i.e. the electrical waveform is spectrally separated from the measurement current. In that way, the first component of the output voltage and the second component thereof can be easily separated by the control and evaluation circuit.

Preferably, the control and evaluation circuit comprises a processing chain for identifying the first component, the processing chain for identifying the first component comprising a filter operatively connected to the transimpedance amplifier, the filter being configured so as to suppress the second component.

The control and evaluation circuit may comprise a processing chain for identifying the second component. The processing chain for identifying the second component may comprise a synchronous rectifier, synchronized on the waveform, and a low-pass filter, for identifying the second component of the output voltage. Specifically, the processing chain for identifying the second component could comprise a mixer, operatively connected with the transimpedance amplifier and the electrical waveform generator for multiplying the output voltage with the waveform, and a low-pass filter.

Preferably, the processing chain for identifying the second component comprises an IQ demodulator for identifying the second component as a complex voltage comprising an in-phase part and a quadrature-phase part. In this case, the control and evaluation circuit may be configured to detect the short circuit and/or broken wire by monitoring whether the complex voltage remains within a predefined area of the complex plane.

The electrical waveform generator may comprise an AC signal source, such as, e.g. an oscillator.

According to a preferred variant of the invention, the electrical waveform generator is configured to generate a pseudo-random noise waveform, e.g. a sine carrier wave modulated by a binary pseudo-random noise code.

According to a particularly preferred variant of the invention, the control and evaluation circuit comprises an analog-to-digital converter operatively connected with the transimpedance amplifier for converting the output voltage into a digital signal and a processor configured to identify the first component and the second component by analyzing the digital signal. The processor could e.g. comprise an application-specific integrated circuit (ASIC), a digital signal processor (DSP), a field-programmable gate array (FPGA), or a microcontroller.

BRIEF DESCRIPTION OF THE DRAWINGS

Further details and advantages of the present invention will be apparent from the following detailed description of several not limiting embodiments with reference to the attached drawings, wherein.

DESCRIPTION OF PREFERRED EMBODIMENTS

Figure 1:
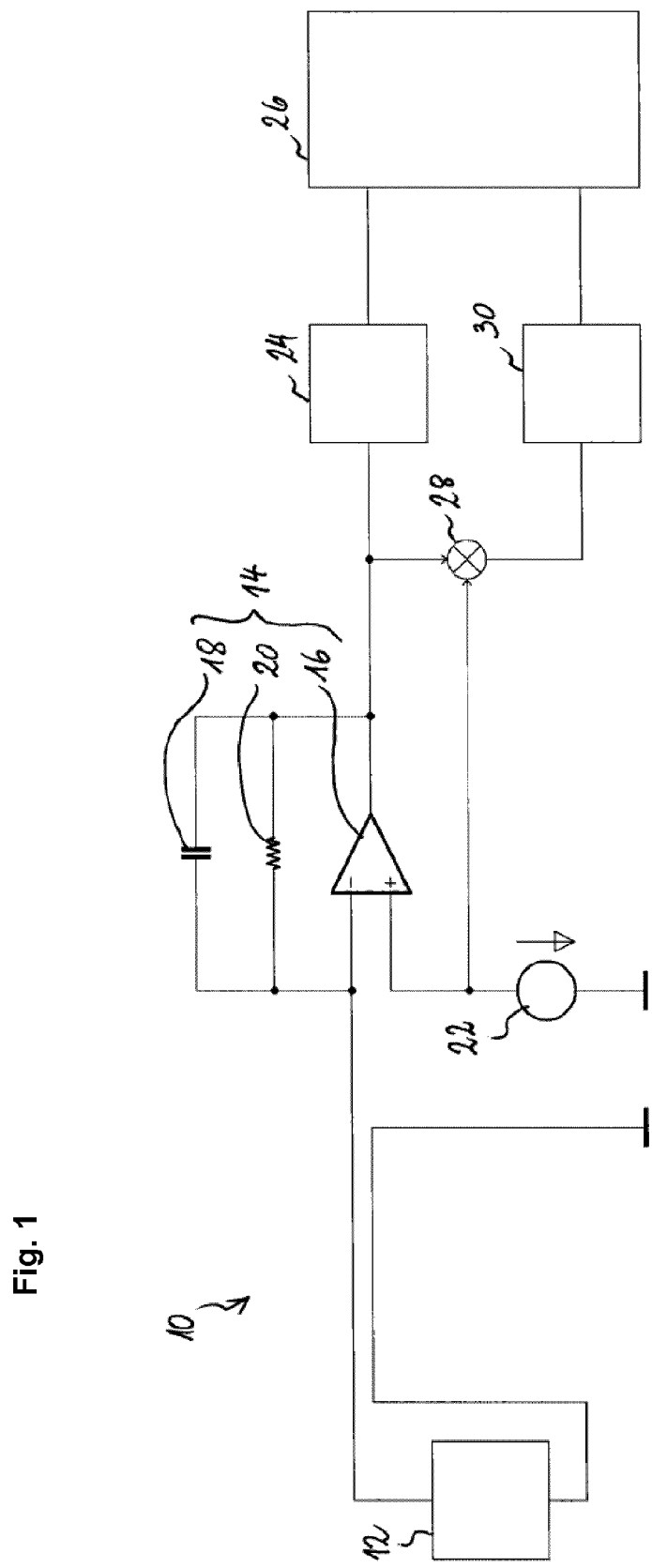
FIG. 1 is a block schematic diagram of a piezoelectric sensing device according to a first preferred embodiment of the invention.

FIG. 1 shows a piezoelectric sensing device 10 according to a first preferred embodiment of the invention. The piezoelectric sensing device 10 comprises a piezoelectric transducer 12 that produces a current (referred to herein as the "measurement current") in response to a mechanical stimulus (vibration, movement, strain or the like). The transducer 12 is connected between ground and the first input of a transimpedance amplifier 14. The transimpedance amplifier 14 (depicted as including an operational amplifier 16 and a feedback network with a capacitor 18 and a resistor 20) converts the current from the transducer 12 into a corresponding voltage on the output terminal of the transimpedance amplifier 14. The second input (reference input) of the transimpedance amplifier 14 is connected to a diagnostics signal source 22, which applies a variable voltage signal (electrical waveform) to the second input. The transimpedance amplifier 14 attempts to maintain a zero voltage difference between its first and second input by driving a current across the feedback network, i.e. across the transducer 12. The output voltage of the transimpedance amplifier is thus modulated in consequence. The total current flowing across the transducer 12 thus corresponds to the sum of the diagnostics current (caused by the voltage modulation at the second input) and the measurement current (i.e. the electrical response to a mechanical stimulus). The total current can be calculated as the ratio between the output voltage of the transimpedance amplifier and the impedance of the transducer 12 and its wiring.

The modulation imposed by the diagnostics signal source 22 is chosen such that it does not significantly overlap in frequency with the measurement signal. In practice, this may best be achieved by selecting the frequency band containing the modulation well above the upper bound of the frequency band containing the measurement signal. For instance, the frequency spectrum of the measurement signal could range from a few Hz up to some kHz (e.g. from 1 Hz to 1 kHz). A possible frequency range for the diagnostics signal could then be from 10 kHz to 100 KHz (or even higher).

The output of the transimpedance amplifier 14 is routed to a first and a second processing chain. The first chain extracts the component of the output voltage that is caused by the transducer 12, whereas the second chain extracts the component of the output voltage that results from the modulation of the voltage at the second input.

For extracting the first component of the output voltage (indicative of the measurement current), the output terminal of the transimpedance amplifier is connected to the filter 24, which removes all frequencies of the modulation band. The filter output is connected to a first ADC (analog-to-digital converter) input of a microcontroller 26, which evaluates the measurement signal (e.g. detects the presence of a human when the piezo transducer is arranged in a floor covering or a seat).

The output of the transimpedance amplifier is also routed to a multiplying mixer (frequency mixer) 28 which is driven at its LO (local oscillator) input with the modulation signal generated by the diagnostics signal source 22. The output of the multiplying mixer 28 is routed to low-pass filter 30, and from there a second ADC input of the microcontroller 26. The multiplying mixer 28 and the low-pass filter 30 co-operate as a synchronous rectifier. The voltage at the output of filter 30 is therefore indicative of the conductance of the transducer 12 and its wiring. The microcontroller 26 monitors the voltage at the output of filter 30 by comparing it with a first threshold to detect a short circuit, and a second threshold to detect an open circuit (broken wire). In other words, if the monitored voltage leaves a predefined range of values, the microcontroller 26 detects a short circuit or a circuit interruption. A corresponding warning signal may then be issued and the evaluation of the measurement signal be suspended.

Figure 2:
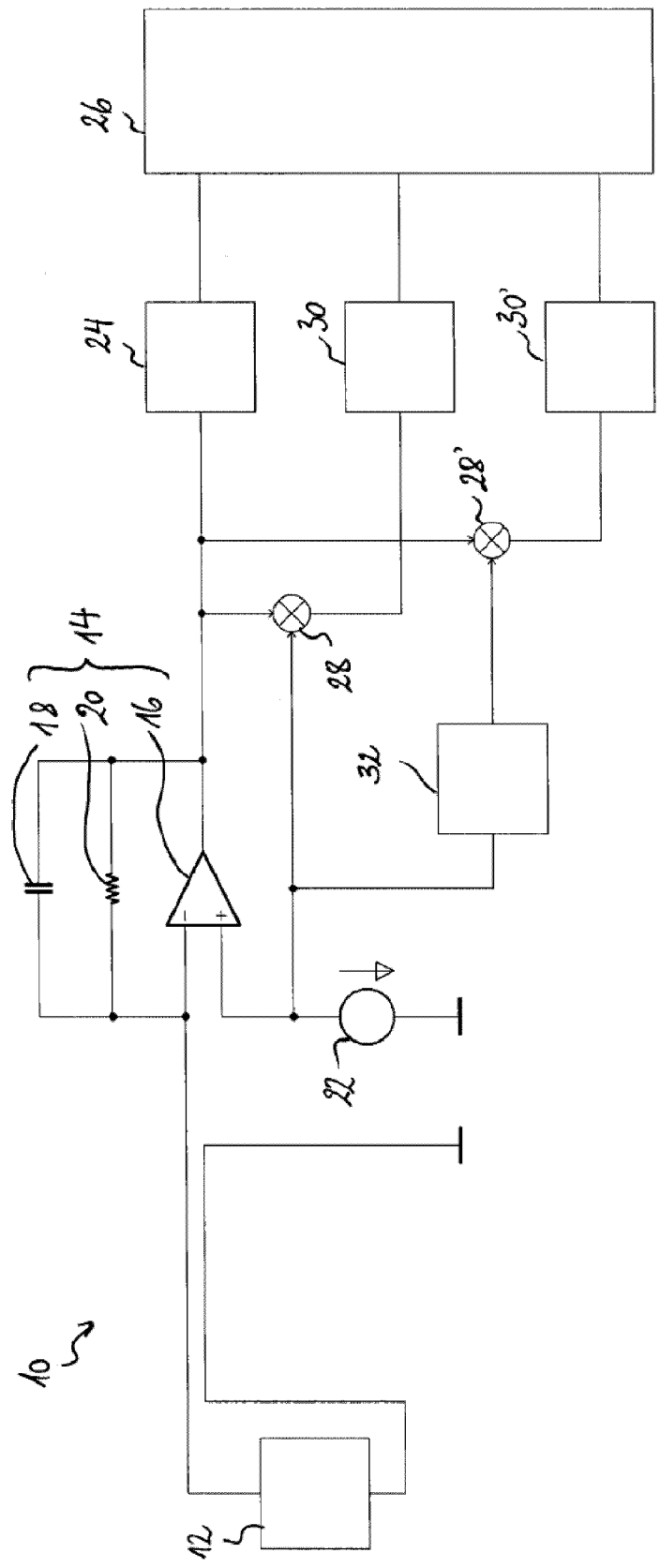
FIG. 2 is a block schematic diagram of a piezoelectric sensing device according to a second preferred embodiment of the invention.

FIG. 2 shows a piezoelectric sensing device 10 according to a second preferred embodiment of the invention. The device of FIG. 2 differs from the device of FIG. 1 only in that it is arranged and configured for full IQ-demodulation of the diagnostics signal. Low-pass filter 30 outputs the in-phase (I-) part (denoted $v_x$) of the diagnostics signal. A second synchronous rectifier (composed of multiplying mixer 28' and low-pass filter 30') is provided that outputs the quadrature-phase (Q-) part (denoted $v_y$) of the diagnostics signal. To this end the mixer 28' is driven at its LO input with a 90-degree-phase-shifted copy of the modulation voltage, which is provided by phase shifter 32. The complex voltage $v_x+j\ v_y$ is indicative of the complex impedance of the transducer 12 and its wiring. The microcontroller 26 may thus monitor whether the complex voltage remains within a predefined area of the complex plane and output a warning signal if it detects abnormal impedance.

Figure 3:
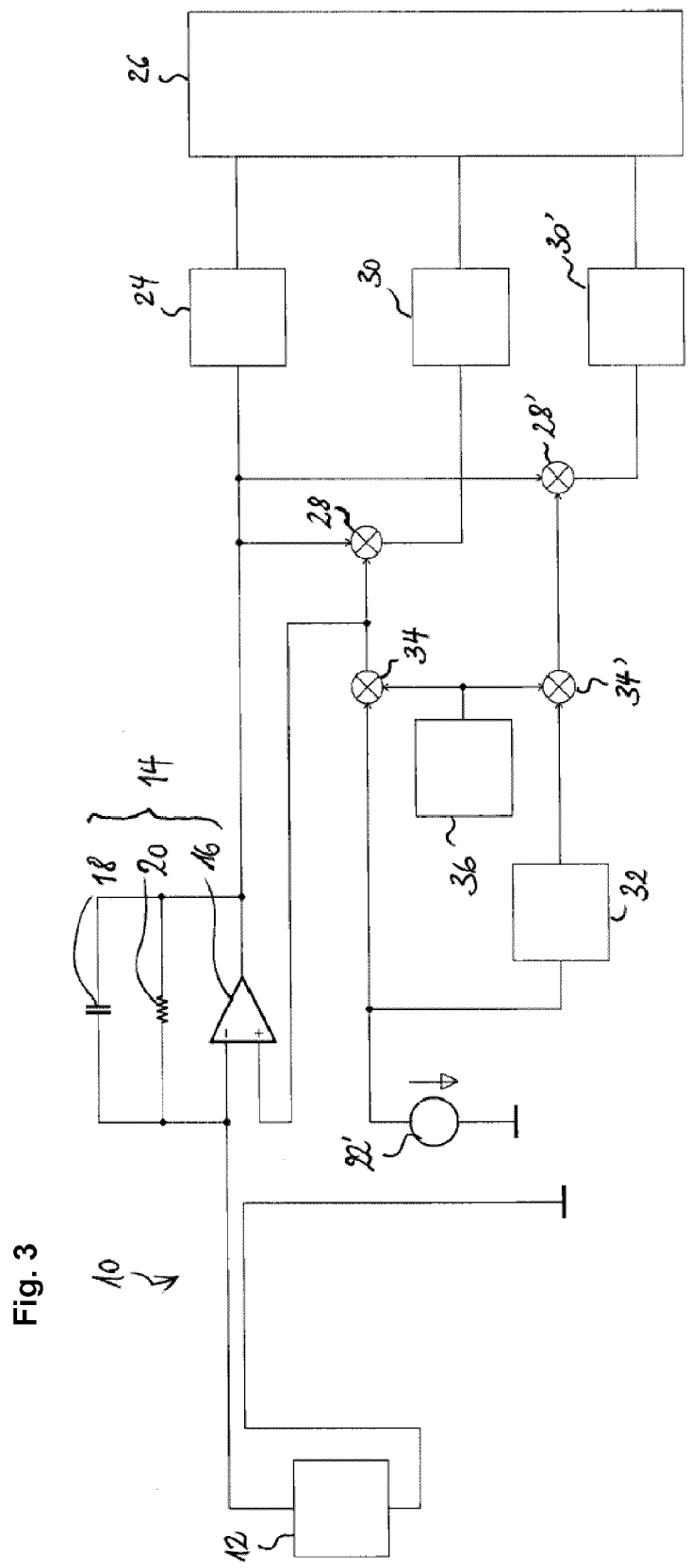
FIG. 3 is a block schematic diagram of a piezoelectric sensing device according to a third preferred embodiment of the invention.

FIG. 3 shows a piezoelectric sensing device 10 according to a third preferred embodiment of the invention. The device of FIG. 3 is similar to the one shown in FIG. 2. Only the differences will thus be discussed hereinafter. Pseudo-random noise code generator 36 (e.g. a linear feedback shift register) produces a binary pseudo-random noise waveform, which is multiplied in multiplying mixer 34 with a sine carrier wave output by oscillator 22'. (Oscillator 22', mixer 34 and pseudo-random noise code generator 36 form together an electrical waveform generator.) The spread-spectrum signal output by the multiplying mixer 34 serves as the reference voltage input to the transimpedance amplifier 14.

The multiplying mixer 28 multiplies the output voltage of the transimpedance amplifier 14 with the original spread-spectrum signal. The low-pass filter 30 thus outputs the in-phase part ($v_x$) of the output voltage of the transimpedance amplifier. The cutoff frequency of filters 30, 30' is chosen substantially lower than the bit rate (also called chip rate) of the PRN signal. The multiplying mixer 28' multiplies the output voltage of the transimpedance amplifier 14 with a copy of the spread-spectrum signal, in which the carrier wave has been shifted by 90 degrees. The low-pass filter 30' thus outputs the quadrature-phase part ($v_y$) of the output voltage of the transimpedance amplifier. The microcontroller 26 monitors the complex voltage $v_x+j\,v_y$ (indicative of the impedance of the transducer 12 and its wiring) and outputs a warning signal if it detects an abnormal impedance.

The use of a pseudo-random noise code on the diagnostics signal is especially useful if interference with other electronic devices shall be avoided. Interfering signals are indeed cancelled in the low-pass filters 30, 30' unless they present high cross-correlation with the pseudo-random noise code, which is very unlikely. Furthermore, interference signals coming from the piezo or electret transducer itself are suppressed. This allows the measurement frequency spectrum and the diagnostics frequency spectrum to overlap without affecting the self-diagnostic capabilities of the device.

Figure 4:
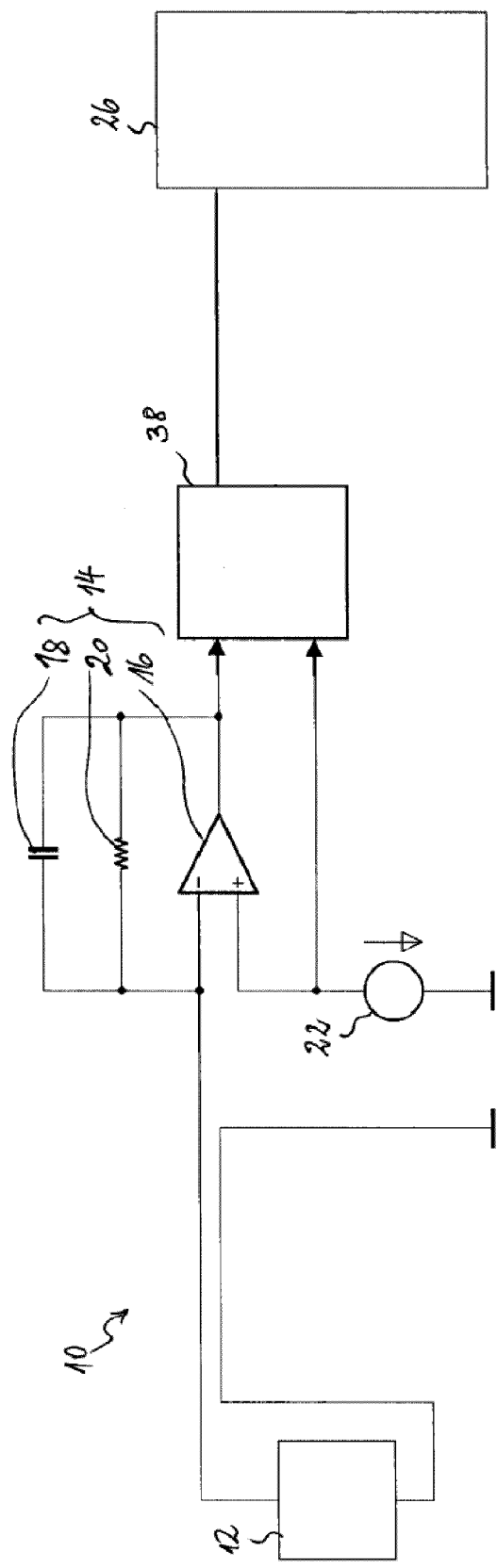
FIG. 4 is a block schematic diagram of a piezoelectric sensing device according to a fourth preferred embodiment of the invention.

A fourth preferred embodiment of the invention is illustrated in FIG. 4. According to this embodiment, the transimpedance amplifier 14 and the diagnostic signal source 22 are connected to an ADC (analog-to-digital converter) 38. The ADC 38 samples the voltage output by the transimpedance amplifier 14 at a sampling rate sufficiently high to allow the microcontroller 26 to extract the IQ information at the frequency of the diagnostic signal. The ADC 38 may be clocked by the diagnostic signal source. The microcontroller 26 then performs signal-processing corresponding to the embodiments of FIG. 1, 2 or 3 on the digital signal.

While specific embodiments have been described in detail, those skilled in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

The invention claimed is:

1. A piezoelectric or electret sensing device, comprising a piezoelectric or electret transducer for producing a measurement current in response to mechanical stimulus,
   and a control and evaluation circuit connected to said transducer;
   said control and evaluation circuit comprising a transimpedance amplifier having a first input and a second input, said transducer being operatively connected between said first input and a reference node; and
   an electrical waveform generator for generating an electrical waveform spectrally separated from said measurement current, said electrical waveform generator operatively connected between said second input and said reference node;
   said transimpedance amplifier being configured to control said first input such that a difference in electric potential between said first input and said second input be cancelled and to output an output voltage, with respect to a potential at said reference node, indicative of electrical current flowing across said transducer;
   wherein said control and evaluation circuit is configured to identify within said output voltage a first component of said output voltage indicative of said measurement current and a second component of said output voltage, said second component being spectrally separate from said first component and indicative of current caused by generation of said waveform;
   and wherein said control and evaluation circuit is configured to detect at least one of a short circuit or a broken wire based upon said second component.

2. The sensing device as claimed in claim 1, wherein said control and evaluation circuit comprises a processing chain for identifying said first component, said processing chain for identifying said first component comprising a filter operatively connected to said transimpedance amplifier, said filter being configured so as to suppress said second component.

3. The sensing device as claimed in claim 1, wherein said control and evaluation circuit comprises a processing chain for identifying said second component, said processing chain for identifying said second component comprising a synchronous rectifier, synchronized on said waveform.

4. The sensing device as claimed in claim 1, wherein said control and evaluation circuit comprises a processing chain for identifying said second component, said processing chain for identifying said second component comprising a mixer, operatively connected with said transimpedance amplifier and said electrical waveform generator for multiplying said output voltage with said waveform, and a low-pass filter.

5. The sensing device as claimed in claim 1, wherein said control and evaluation circuit comprises a processing chain for identifying said second component, said processing chain for identifying said second component comprising an IQ demodulator for identifying said second component as a complex voltage comprising an in-phase part and a quadrature-phase part.

6. The sensing device as claimed in claim 1, wherein said electrical waveform generator comprises an AC signal source, such as, e.g. an oscillator.

7. The sensing device as claimed in claim 1, wherein said electrical waveform generator is configured to generate a pseudo-random noise waveform, e.g. a sine carrier wave modulated by a binary pseudo-random noise code.

8. The sensing device as claimed in claim 1, wherein said control and evaluation circuit is configured to detect said at least one of a short circuit or a broken wire by comparing said second component with a threshold.

9. The sensing device as claimed in claim 1, wherein said control and evaluation circuit comprises an analog-to-digital converter operatively connected with said transimpedance amplifier for converting said output voltage into a digital signal and a processor configured to identify said first component and said second component by analysing said digital signal.

10. The sensing device as claimed in claim 9, wherein said processor comprises at least one of an application-specific integrated circuit, a digital signal processor, a field-programmable gate array and a microcontroller.

11. The sensing device as claimed in claim 1, wherein said control and evaluation circuit is configured to detect said short circuit or broken wire by comparing the second component with a respective threshold.

12. The sensing device as claimed in claim 5, wherein said control and evaluation circuit is configured to detect said short circuit or broken wire by monitoring whether said complex voltage remains within a predefined area of the complex plane.

* * * * *